United States Patent [19]

Wu et al.

[11] Patent Number: 4,584,026

[45] Date of Patent: Apr. 22, 1986

[54] ION-IMPLANTATION OF PHOSPHORUS, ARSENIC OR BORON BY PRE-AMORPHIZING WITH FLUORINE IONS

[75] Inventors: Chung P. Wu, Mercer, N.J.; George L. Schnable, Lansdale, Pa.

[73] Assignee: RCA Corporation, Princeton, N.J.

[21] Appl. No.: 634,397

[22] Filed: Jul. 25, 1984

[51] Int. Cl.$^4$ ........................................... H01L 21/265
[52] U.S. Cl. .................................... 148/1.5; 29/576 B; 148/187; 148/DIG. 24; 357/91
[58] Field of Search ............... 148/1.5, 187; 29/576 B, 29/571; 357/91

[56] References Cited

U.S. PATENT DOCUMENTS

| | | | |
|---|---|---|---|
| 3,887,994 | 6/1975 | Ku et al. | 29/571 |
| 4,133,704 | 1/1979 | MacIver et al. | 148/1.5 |
| 4,144,100 | 3/1979 | MacIver et al. | 148/1.5 |
| 4,240,096 | 12/1980 | Hiraki et al. | 357/63 |
| 4,332,627 | 6/1982 | Schmitt et al. | 148/1.5 |
| 4,383,869 | 5/1983 | Liu | 148/1.5 |
| 4,391,651 | 7/1983 | Yoder | 148/1.5 |
| 4,456,489 | 6/1984 | Wu | 148/1.5 |

OTHER PUBLICATIONS

Tsai et al., J. Appl. Phys. 50 (1979) 188.
Ghandi, VLSI Fabrication Principles, pp. 320–329 and 346–348, John Wiley & Sons, 1983.
Wilson, J. Appl. Phys., vol. 54, No. 12, pp. 6879–6889, Dec. 1983.
Beanland, Solid State Electronics, vol. 21, pp. 537–547, 1978.

*Primary Examiner*—Upendra Roy
*Attorney, Agent, or Firm*—Birgit E. Morris; R. Hain Swope

[57] ABSTRACT

A process of forming a low-dose ion implant of one or more of phosphorus, arsenic or boron is described. The desired impurity ion implant is preceded by an amorphizing implant of at least about $10^{15}$ ions/cm$^2$ of fluorine ions. The implants are advantageously annealed at a temperature below about 800° C.

10 Claims, No Drawings

ION-IMPLANTATION OF PHOSPHORUS, ARSENIC OR BORON BY PRE-AMORPHIZING WITH FLUORINE IONS

This invention relates to the ion implantation of low doses of one or more of phosphorus, arsenic and boron in a silicon substrate.

BACKGROUND OF THE INVENTION

The ion implantation of energetic impurity atoms into a silicon substrate to change its electronic properties is commonplace in the electronics industry. The trend in the industry is toward increasing complexity of integrated circuits and decreasing device dimensions. This requires more rigid tolerances and lower defect densities. Shallow doping profiles are often required and, as a consequence thereof, processing temperatures should be lowered from over 1000° C., the range in conventional use, to below 900° C., preferably substantially below 900° C.

Lower processing temperatures are required to minimize diffusion of the implant and consequent loss of resolution, thereby achieving tighter tolerances and smaller dimensions for devices. Lower processing temperatures are also desirable in that they increase the number and variety of materials that can be present in or on the substrate when implantation is carried out. There is, in general, a quest in the semiconductor industry for lower processing temperatures in all phases of device manufacture.

For an ion-implanted impurity to be electrically active, it must be located in substitutional sites in the crystal lattice of the surface layer of the substrate after annealing. When the damage caused to the crystal lattice by ion implantation is not sufficient to amorphize the surface of a silicon substrate, lower processing temperatures may not cause the implant to become substitutional. Therefore, annealing temperatures of at least about 1000° C. are required to make the implant electrically active. Such high temperatures are undesirable in that they cause diffusion from the implant which has an adverse effect on the implant profile.

When there is sufficient damage caused by the ion implant of the impurity to amorphize the surface of the silicon substrate, lower processing temperatures may produce sufficient regrowth of the amorphized silicon by solid-phase epitaxy to restore the surface with minimal crystal defects and have the implanted ions located in substitutional sites. A low-dose implant, i.e. below about $10^{15}$ ions/cm$^2$, of phosphorus, arsenic or boron will not produce the desired degree of damage in the silicon substrate to contemplate the use of lower processing temperatures. It has been necessary, therefore, to either utilize annealing temperatures of at least about 1000° C. or to create the necessary degree of damage for such implants to become electrically active at lower processing temperatures.

One method of creating the damage necessary for an impurity implant to become substitutional upon annealing is to implant molecular ions, for example, implanting boron as BF$^+$ or BF$_2$$^+$ instead of the pure ion, i.e. B$^+$. Molecular ions, in sufficient concentration, produce enough damage in the surface of the crystalline silicon substrate to create an amorphous layer, whereas a pure ion implant of B$^+$ requires a significantly higher annealing temperature to obtain high sheet conductivity in the layer. The advantage of implanting molecular ions can be demonstrated by forming diodes with B$^+$, BF$^+$ and BF$_2$$^+$ implants at $10^{15}$ ions per square centimeter. The BF$_2$$^+$ implanted diodes clearly demonstrate the lowest leakage current. The advantages of using molecular ions such as BF$^+$, BF$_2$$^+$, PF$^+$, AsF$^+$ and the like, however, do not hold true for low-dose implants which leave the silicon surface substantially unamorphized.

Another known method of creating the damage necessary for an impurity ion implant to become substitutional is to pre-implant the surface of the silicon to damage or amorphize it. While it is known that any atom can amorphize silicon, such amorphizing ion implants are generally carried out with inert ions such as silicon, neon or argon. Active ions, such as the halogens, are generally avoided for amorphizing implants.

An additional active ion is utilized as an amorphizing implant, however, in the process disclosed in MacIver et al., U.S. Pat. No. 4,144,100, issued Mar. 13, 1979. Implantation of such ions, e.g. fluorine or chlorine, is carried out coextensive with or preferably, following a low-dose phosphorus ion implant. The <100> p-type silicon substrate is then annealed in an oxidizing atmosphere at a temperature of at least 900° C., preferably at 1000°–1200° C. It is stated that amorphizing ion implants with inert gases or nitrogen were not of any significant benefit in the stated object of preventing leakage from the diodes formed by the process.

In accordance with this invention, a method of forming an electrically effective low-dosage ion implant of phosphorus, arsenic or boron has been found which advantageously, does not require high annealing temperatures. That the subject process utilizes lower than conventional annealing temperatures is a significant improvement in view of the ongoing need for lower processing temperatures in semiconductor device manufacturing.

BRIEF SUMMARY OF THE INVENTION

A low-dose impurity ion implant of one or more of phosphorus, arsenic or boron in the surface of a silicon substrate is preceded by an amorphizing ion implant of fluorine which is electrically inert with regard to the impurity ion implant as well as the silicon substrate. This technique provides an excellent, electrically-active, low-dosage ion implant of phosphorus, arsenic or boron without utilizing high annealing temperatures.

DETAILED DESCRIPTION OF THE INVENTION

The present invention is directed to forming low-dose ion implants of one or more of phosphorus, arsenic or boron in a silicon substrate such as conventional silicon wafers. A low-dose implant is recognized as being about $10^{14}$ ions per square centimeter or below. A preferred implant dose of phosphorus, arsenic or boron ions in accordance with this invention is from about $10^{12}$ to about $10^{14}$ ions/cm$^2$. Such an implant is useful in very-large-scale integrated (VLSI) circuit manufacture in forming polysilicon resistors, diodes, channel implants and the like.

The impurity ions implanted into a silicon substrate is accordance with this invention, i.e. phosphorus, arsenic or boron ions, may be implanted individually or sequentially to form a multiple implant of two or all in any order. Conventionally, sequential ion implants of phosphorus and arsenic are most commonly used. This is because phosphorus and arsenic are n-type impurities, whereas boron is p-type. However, multiple sequential implants of boron and phosphorus and/or arsenic ions are contemplated herein. When more than one of the subject impurity ions are sequentially implanted as contemplated herein, each is implanted in a low dose.

Under normal circumstances, a low-dose implant, i.e. $10^{14}/cm^2$ and below, of the subject impurity ions will not damage the surface of the silicon wafer sufficiently to completely amorphize the silicon so that, upon annealing, the silicon will regrow with minimal crystalline defects and the implant will become substitutional and, therefore, electrically active. It is conventional to heat the substrate to a temperature well in excess of 900° C. to anneal the damage to the substrate and have the implant become substitutional. At such temperatures, however, diffusion takes place from the implant. Both the diffusion and the temperatures utilized have an adverse effect on the device.

Methods of amorphizing the surface of the silicon substrate, including amorphizing implantation, have been discussed. Since amorphizing ion implants are conventionally inert ions, it is considered unexpected that an amorphizing implant of the most active ion, i.e. fluorine, preceding an implant of the subject impurity ions will be electrically inert with regard thereto. More importantly, it is considered unexpected that the method of this invention provides a totally effective anneal at temperatures significantly lower than those conventionally used heretofore.

In contract to the dose of phosphorus, arsenic or boron ions implanted in accordance with this invention, the dose of fluorine ion is large, i.e. at least about $10^{15}$ ions/cm$^2$. It is necessary that the fluorine ion implant not be substantially deeper than the phosphorus, arsenic or boron implants which penetrate the silicon to from about 0.1 micrometer up to a depth of about 1.0 micrometer. Therefore, it is necessary to implant the fluorine ions at a lower energy than that used for phosphorus or arsenic and at a higher energy than that used for boron. The dose of the fluorine implant is from about $10^{15}$ to about $10^{16}$ ions/cm$^2$, preferably about $2 \times 10^{15}$ ions/cm$^2$. It is also contemplated, for deeper implants, to utilize two or more implants of fluorine ions at different energy levels to obtain a uniformly amorphized substrate layer to the desired depth. The substrate will suitably be conventionally photolithographically masked for the ion implant procedure which is carried out using conventional equipment.

After the amorphizing implant with fluorine ions, the substate is conventionally ion implanted with a low dose of one or more of phosphorus, arsenic or boron ions. The dose of each implanted impurity is suitably from about $10^{12}$ to about $10^{14}$ ions/cm$^2$, preferably about $5 \times 10^{13}$ ions/cm$^2$.

The implant is then annealed at a temperature of below about 800° C. It is preferred that a heat means be utilized which heats the whole wafer, i.e. a furnace or a high-intensity visible light heating means, as opposed to a heating means such as a laser, which heats only the surface. It is preferred to heat the whole substrate because less stress is created than when only the surface is heated. Annealing is suitably carried out in an inert ambient such as nitrogen.

A low-dose phosphorus ion implant is annealed in accordance with this invention at from about 600° to 700° C., preferably at about 650° C. A low-dose arsenic or boron ion implant is annealed at from about 700° to 800° C., preferably about 750° C. A multiple implant of the subject impurity ions is annealed at the higher temperature. These temperatures are significantly below those conventionally used to anneal implants of the subject impurity ions yet, unexpectedly, produce an excellent, electrically-active implant.

If the substrate is annealed in a furnace over a period of, for example, about 30 minutes, the fluorine implant will be substantially or completely removed. If the substrate is rapidly annealed, suitably by high-intensity light heating means, or graphite strip heating means, for 60 seconds or less, most of the fluorine ions will remain in the substrate. Since we have found that the fluorine ion implant is inert to the electrical properties and function of the subject impurity implants, the fact that it remains in the substrate is of no consequence to the ultimate use of the device. It is considered unexpected that the subject ion implants can be rapidly annealed in a minute or less without driving the fluorine out and still have the subject impurity implants become substitutional and, therefore, electrically active.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Single-crystal silicon wafers of p-type and <100> orientation were coated with a 1.0 micrometer thick layer of photoresist which was conventionally patterned, thus exposing predetermined areas of the wafer surface. Utilizing a commercial ion accelerator, a series of such wafers was implanted at ambient temperature with fluorine ions at 50 keV to a dosage of $2 \times 10^{15}$ ions/cm$^2$.

The wafers were then implanted in the same regions with phosphorus ions at 70 keV to a dosage of $10^{14}$ ions/cm$^2$. The remaining photoresist layer was removed.

The wafers were individually placed in a high-intensity, visible light annealer, Heatpulse by A.G. Associates, and annealed in nitrogen at 600°, 625°, 650°, 700°, 750°, 800° and 900°, respectively, over a period of 10 seconds. The sheet resistance, and therefore the surface conductivity, of the wafers was determined using a four-point probe. A second group of wafers which received only the phosphorus implant was similarly annealed and tested.

The wafers receiving both fluorine and phosphorus implants reached an effective level of conductivity at about 625°. The level of conductivity remained relatively constant through 900°. The wafers receiving only the phosphorus implant, in contrast, did not reach an effective level of conductivity until about 750°. There was a modest increase in conductivity as the temperature was raised to 900°.

EXAMPLE 2

Wafers, pattern masked as in Example 1, were ion implanted with fluorine at 50 keV to a dosage of $2 \times 10^{15}$ ions/cm$^2$. The fluorine ion implant was followed by an arsenic ion implant at 150 keV to a dosage of $5 \times 10^{13}$ ions/cm$^2$. A second group of wafers received only the arsenic implant. The wafers were annealed as in Example 1 in nitrogen at 600°, 650°, 700°, 750°, 800° and 900°, respectively. Measurements were taken as in Example 1.

The double-implanted wafers of this invention reached a useful level of conductivity at about 700°, whereas those receiving only arsenic ions reached a useful conductivity level at close to 800°. The conductivity of the wafer receiving only arsenic ions, annealed at 800°, was somewhat higher. This does not offset the significantly lower processing temperatures achievable with the process of this invention.

Analysis of the wafers in both Examples by secondary ion mass spectroscopy (SIMS) showed that most of the implanted fluorine ions remained in the wafer. There was substantially no evidence in either instance of the formation of volatile fluorine compounds with phosphorus or arsenic, as might be expected when fluorine is the first ion implanted. The significant advantage in processing temperatures realized in accordance with this invention is clearly demonstrated by the data presented in these Examples.

We claim:

1. A process of forming a low-dose ion implantation of one or more impurity ions selected from phosphorus, arsenic and boron comprising the sequential steps of: implanting the substrate with a dosage of at least about $10^{15}$ ions per square centimeter of fluorine ions: implanting with said impurity ion at a dosage of about $10^{14}$ ions per square centimeter or less; and annealing in an inert ambient at a temperature of below about 800° C., wherein said fluorine ion implant is not substantially deeper than said impurity ion implant.

2. A process in accordance with claim 1, wherein the flourine ion implant is about $2\times 10^{15}$ ions per square centimeter.

3. A process in accordance with claim 1, wherein the impurity ion implant is about $5\times 10^{13}$ ions per square centimeter.

4. A process in accordance with claim 1, wherein the inert ambient is nitrogen.

5. A process in accordance with claim 1, wherein said impurity ion is phosphorus and the implant is annealed at a temperature of from about 600° C. to about 700° C.

6. A process in accordance with claim 1, wherein said impurity ion is arsenic and the implant is annealed at a temperature of from about 700° C. to about 800° C.

7. A process in accordance with claim 1, wherein said impurity ion is boron and the implant is annealed at a temperature of from about 700° C. to about 800° C.

8. A process in accordance with claim 1, wherein two or more of said impurity ions are implanted sequentially.

9. A process in accordance with claim 8, wherein said impurity ions are phosphorus and arsenic implanted sequentially in either order.

10. A process in accordance with claim 9, wherein said implant is annealed at a temperature of from about 700° C. to about 800° C.

* * * * *